United States Patent [19]
Schneier et al.

[11] Patent Number: 5,710,058
[45] Date of Patent: Jan. 20, 1998

[54] METHOD OF MAKING MULTI-TERMINAL RESONANT TUNNELING TRANSISTOR

[75] Inventors: Neal Joshua Schneier, Rolling Hills Estates; John Joseph Berenz, San Pedro, both of Calif.

[73] Assignee: TRW Inc., Redondo Beach, Calif.

[21] Appl. No.: 552,024

[22] Filed: Nov. 2, 1995

Related U.S. Application Data

[62] Division of Ser. No. 227,921, Apr. 15, 1994, Pat. No. 5,514,876.
[51] Int. Cl.$^6$ .................................................. H01L 21/203
[52] U.S. Cl. .................. 437/107; 437/110; 437/133
[58] Field of Search .......................... 437/107, 110, 437/133, 184; 148/DIG. 160, DIG. 169

[56] References Cited

U.S. PATENT DOCUMENTS

| | | | |
|---|---|---|---|
| 4,783,427 | 11/1988 | Reed et al. | 437/110 |
| 5,415,128 | 5/1995 | Kao et al. | 437/107 |
| 5,447,873 | 9/1995 | Randall et al. | 437/110 |

*Primary Examiner*—Chandra Chaudhari
*Attorney, Agent, or Firm*—Michael S. Yatsko

[57] ABSTRACT

A transistor according to the invention for simultaneously providing at least two current-voltage characteristics includes a base, a collector, and an emitter. At least one of the base, collector, and emitter includes a first layer grown using molecular beam epitaxy (MBE). The first layer includes a first strip having a first doping characteristic created using focused ion beam processing. A second strip has a second doping characteristic created by focused ion beam processing. A middle section of undoped material is located between the first and second strips. A resonant tunneling junction is grown on the first layer using MBE and includes a plurality of layers.

11 Claims, 3 Drawing Sheets

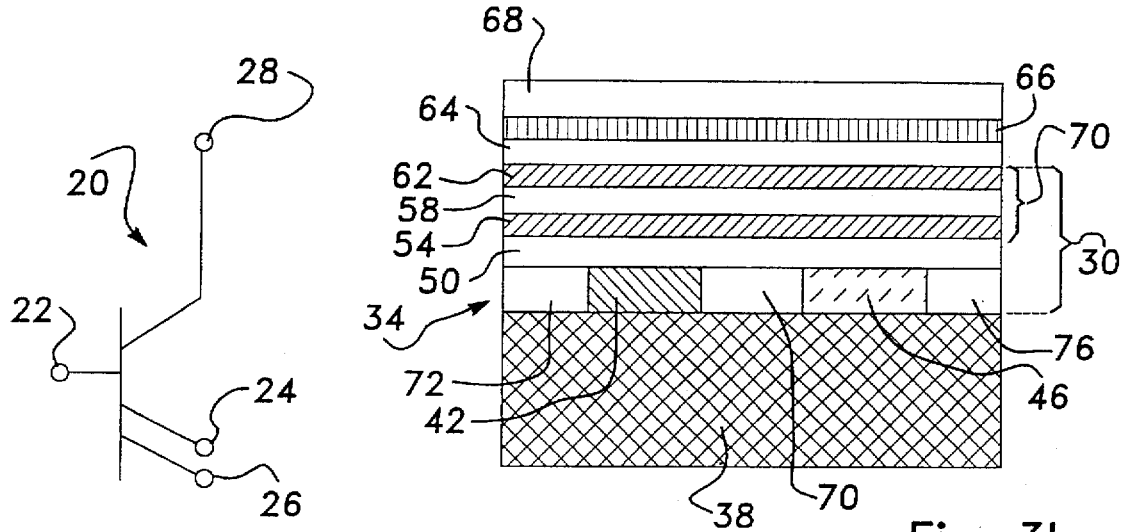
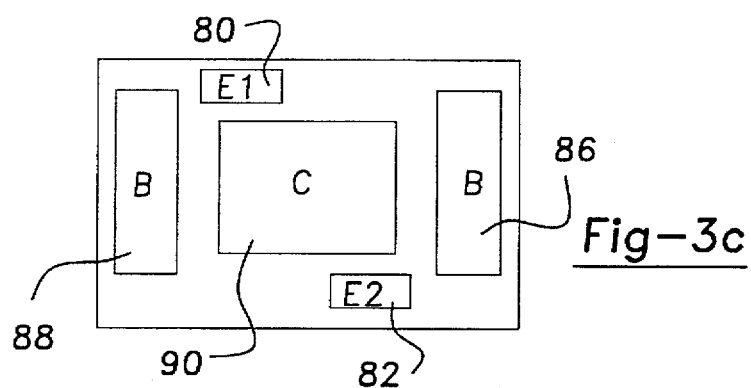
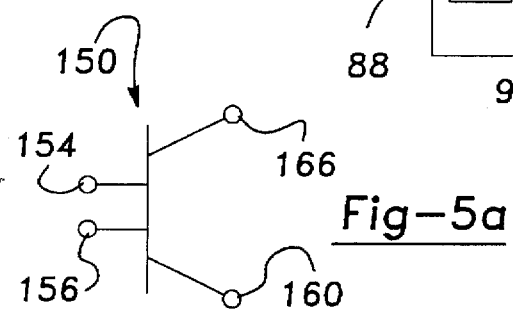
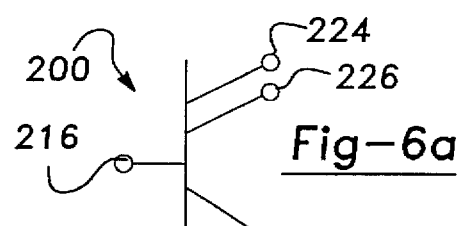
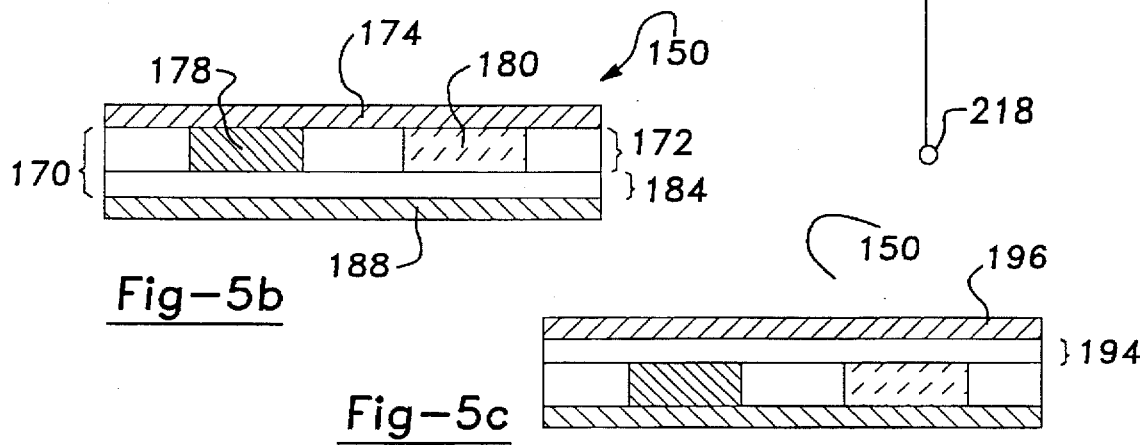

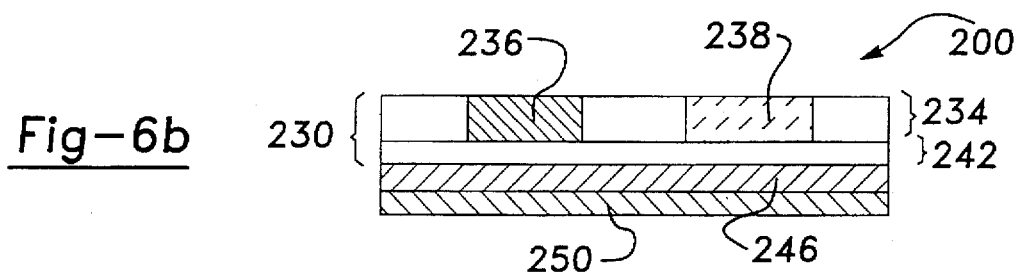
_Fig-6b_
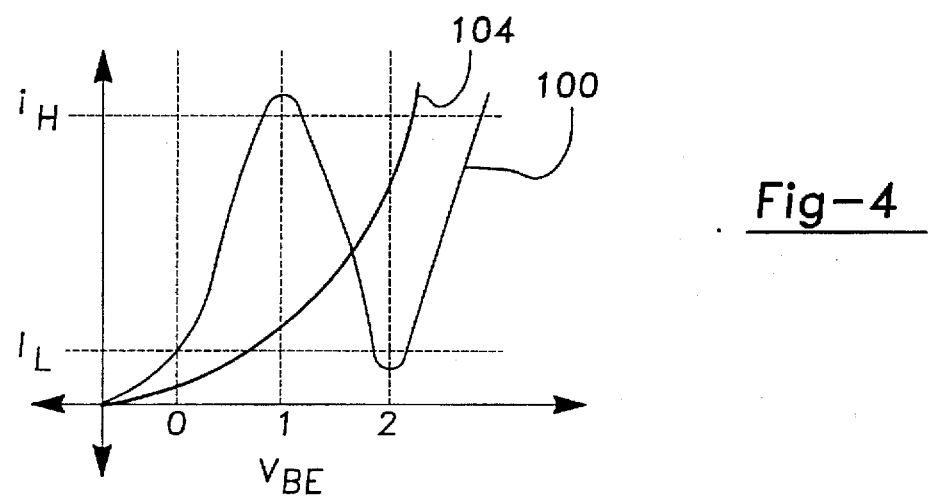
_Fig-4_
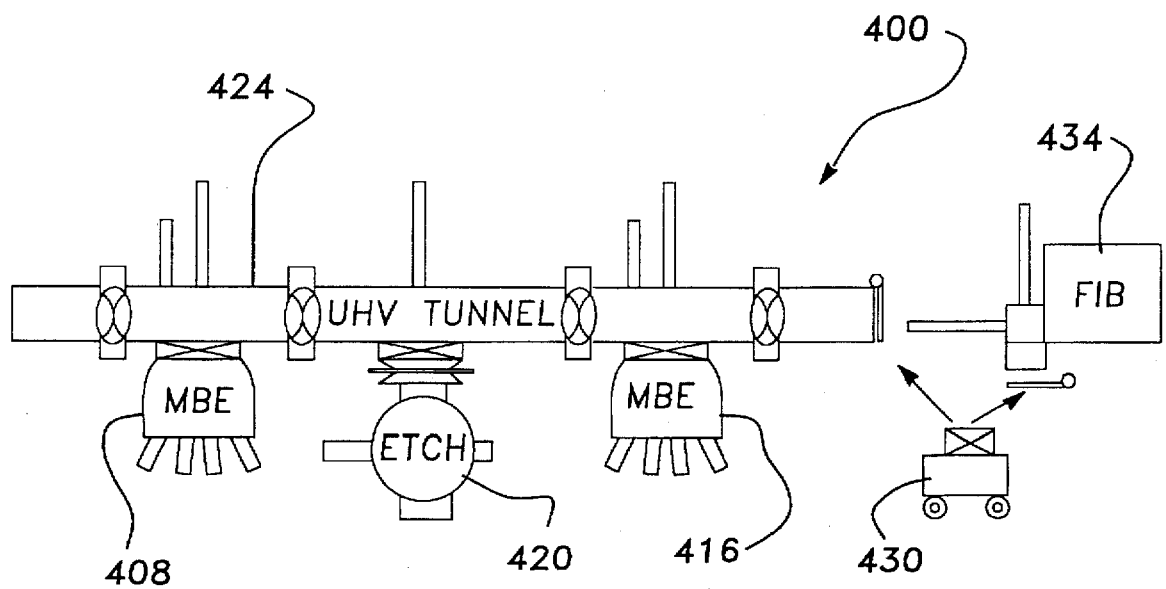
_Fig-7_

METHOD OF MAKING MULTI-TERMINAL RESONANT TUNNELING TRANSISTOR

This is a divisional of U.S. patent application now U.S. Pat. No. 5,514,876 Ser. No. 08/227,921, filed Apr. 15, 1994

BACKGROUND OF THE INVENTION

1. Technical Field

This invention relates to transistors and, more particularly, to transistors fabricated using both focused ion beam and molecular beam epitaxy techniques to provide multiple functions from a single transistor.

2. Discussion

The number of functions an integrated circuit (IC) can perform is limited by the size of the IC. If each IC performs relatively few functions, several ICs must be used to provide the desired functionality, thus increasing system cost. The number of functions an IC can perform can be expressed as a ratio of the number of transistors per IC over the number of transistors per function. The number of transistors per IC is limited by the IC's scale of integration and power dissipation. For example, present day bipolar ICs are limited to 50,000 transistors. The number of transistors per IC can be increased by fabricating smaller transistor feature sizes, requiring very high capital investment. The number of transistors per function is limited by circuit design architecture and can be reduced by using fewer transistors per function which requires clever circuit design. For example a current mode logic (CML) bipolar half adder typically requires 26 transistors.

Conventional resonant tunneling diodes (RTDs) have been employed in multi-valued logic, multi-state memory, and analog-to-digital circuit applications. Conventional resonant tunneling transistors (RTTs) have been employed in digital integrated circuits and have high isolation and gain.

In addition to RTDs and RTTs, conventional resonant tunneling hot electron transistors (RHETs) have a high cutoff frequency (e.g. 120 GHz). A full adder has been fabricated using only seven RHETs and has a 40ps delay time and 20mW power consumption.

While the above-identified devices have decreased IC size and power consumption and increased IC speed, it is desirable to increase the number of functions per IC by reducing the number of transistors per function to further decrease size and power consumption and further increase IC speed.

SUMMARY OF THE INVENTION

A transistor according to the invention for simultaneously providing at least two current-voltage characteristics includes a base, a collector, and an emitter. At least one of the base, collector, and emitter includes a first layer grown using molecular beam epitaxy (MBE). The first layer includes a first strip having a first doping characteristic created using focused ion beam processing. A second strip, in the first layer, has a second doping characteristic created by focused ion beam processing. A middle section of undoped material is located between the first and second strips. A resonant tunneling junction is grown on the first layer using MBE and includes a quantum well layer situated between two barrier layers. Other objects, features, and advantages will be readily apparent.

BRIEF DESCRIPTION OF THE DRAWINGS

The various advantages of the present invention will become apparent to those skilled in the art after studying the following specification and by reference to the drawings in which:

FIG. 3a is an electrical schematic of a first multiple emitter resonant hot electron tunneling transistor (MERHET) including two emitters according to the invention;

FIG. 3b is a cross-sectional view of the MERHET of FIG. 3a;

FIG. 3c is a plan view of the MERHET of FIG. 3b;

FIG. 4 illustrates current-voltage characteristics of the MERHET of FIG. 3a configured as a digital half adder;

FIG. 5a is an electrical schematic of a multiple base resonant hot electron tunneling transistor (MBRHET) including two base terminals according to the invention;

FIG. 5b is a cross-sectional view of a first MBRHET;

FIG. 5c is a cross-sectional view of a second MBRHET;

FIG. 6a is an electrical schematic of a multiple collector resonant hot electron tunneling transistor (MCRHET) including two collectors according to the invention;

FIG. 6b is a cross-sectional view of the MCRHET of FIG. 6a; and

FIG. 7 is a fabricating system for fabricating the multiple emitter, base, and collector resonant hot electron tunneling transistors according to the present invention.

DESCRIPTION OF THE PREFERRED EMBODIMENT

Transistors can be fabricated using molecular beam epitaxy (MBE) which is a technique of growing layers of semiconductor materials with specifiable doping concentrations. MBE deposits atoms or molecules, some of which are semiconductor dopants, across an entire crystalline substrate to create semiconductor layers whose crystallographic orientation is related to the crystallographic orientation of the substrate. The number of dopant atoms per unit volume determines the doping concentration, which, in turn, partially determines the transistor electrical properties. Using MBE, the doping atom, concentration and thickness can be altered for each of the collector (C), base (B), and/or emitter (E) semiconductor layers. While typical semiconductor layer thickness is 2,500 angstroms, MBE can fabricate layers as thin as 50 angstroms. Epitaxial growth of ultra-thin layers creates barrier and quantum-well layers.

Transistors whose C, B, or E terminal is fabricated with multiple thin layers can create resonant tunnelling transistors. MBE grows the C, B, or E using different dopant atoms and can be many layers thick. The transistor layers can be demarked using standard photolithographic techniques.

Focused ion beam (FIB) processing introduces dopants into a semiconductor by bombarding a target surface with a beam of high-energy dopant ions. The dopant ions are typically focused on a narrow area and scanned across the target surface of the semiconductor wafer. The ion beam is computer controlled and the ions are deposited only in targeted areas. The ions consist of dopants which modify the semiconductor properties of the target portions.

The electrical properties of ultra-thin semiconductor layers are determined by quantum mechanics. The energy levels at which the electrons can readily absorb quantized energy are related to a width of the quantum well structures formed by MBE. When the electrons are able to absorb the quantized energy packets, the electrons resonate (hence the name "resonant tunneling" junction or transistor). Current flowing through a quantum well is much higher when the electrons are resonating. This current-voltage transfer function is depicted in FIG. 1.

Figure 1A:
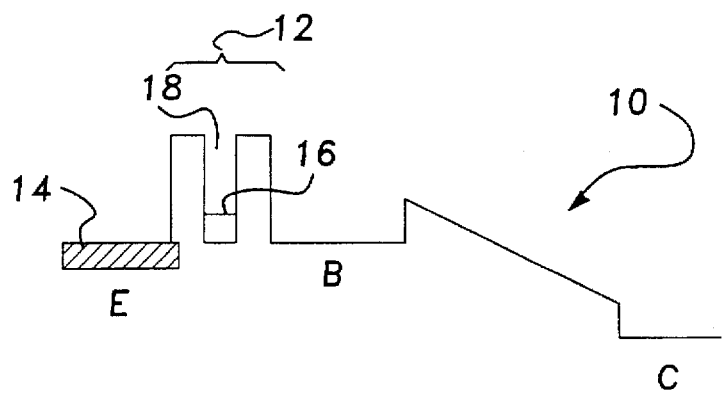
FIGS. 1a, 1b and 1c are energy band diagrams illustrating operating characteristics of a resonant tunneling hot electron transistor (RHET) with a resonant tunnel junction fabricated in an emitter thereof.
Figure 1B:
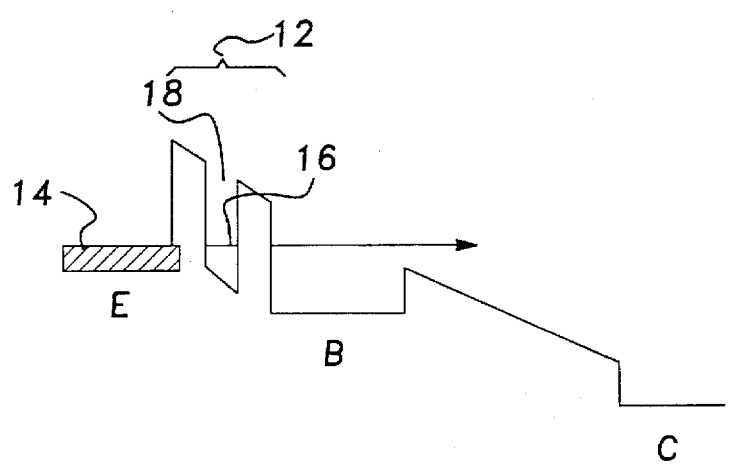
Figure 1C:
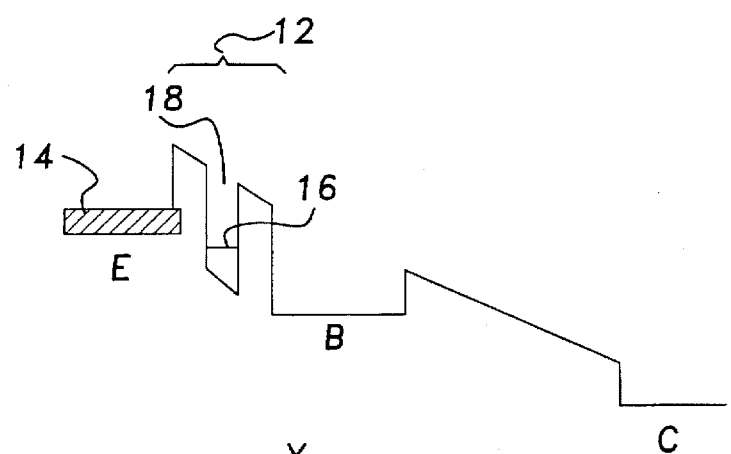

In conventional resonant tunneling hot electron transistors (RHETs) 10, a double barrier resonant tunnel junction (DBRTJ) 12 is fabricated in an emitter layer "E" on the boundary between the emitter layer "E" and a base layer "B". DBRTJ 12 is used as a "hot electron" injector. Energy band diagrams in FIGS. 1a, 1b, and 1c illustrate operating principles and I–V characteristics of RHETs. Energy provided to the electrons increases as the base/emitter voltage increases.

Figure 2:
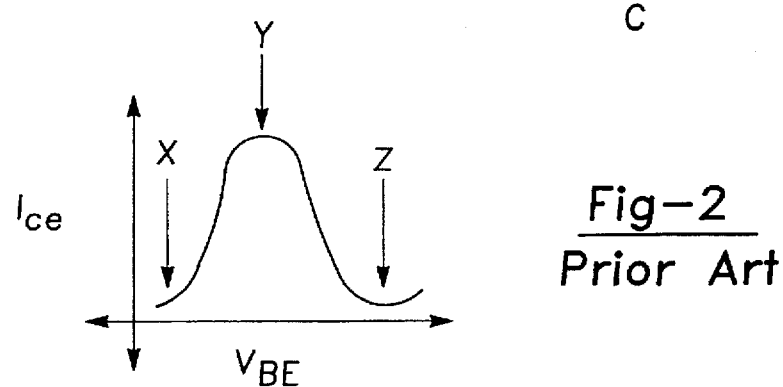
FIG. 2 illustrates collector to emitter current as a function of base to emitter voltage for the RHET of FIG. 1.

Resonant tunneling through DBRTJ 12 occurs when increasing base-emitter voltage causes the Fermi level of the emitter (at 14 in FIGS 1a, 1b, and 1c) to line up with a quantized energy level at 16 of a quantum well (at 18). When the Fermi level of the emitter at 14 is below the quantized energy level at 16 of the quantum well 18 (FIG 1a), little to no current is injected into the base layer B. When the Fermi level of the emitter at 14 lines up with the quantized energy level at 16 of the quantum well 18 (FIG 1b), electrons "e" are injected into base layer B. As the Fermi level (related to the base-emitter voltage) increases further (FIG 1c), the RHET is turned off. FIG. 2 illustrates output current ($I_{CE}$) as a function of the base-emitter voltage. Point "X" (corresponding to FIG 1a) illustrates base-emitter voltage (or Fermi level) below the quantized energy level. Point "Y" (corresponding to FIG 1b) illustrates the base-emitter voltage (or Fermi level) approximately equal to the quantized energy level. Point "Z" (corresponding to FIG 1c) illustrates base-emitter voltage (or Fermi level) greater than the quantized energy level.

Transistors according to the invention utilize MBE to create resonant tunneling transistors using conventional techniques as described above in conjunction with FIGS 1 and 2. FIB processing is then used in multiple passes. A first pass selectively destroys regions of the C, B, or E layer, breaking the C, B, or E terminal into separate, small, isolated terminal regions. The subsequent FIB passes selectively dope the terminal regions to modify the quantum well resonant tunneling characteristics of the terminal. The resultant transistors have multiple collector and/or base and/or emitter terminals, each with unique current-voltage characteristics. Having two different threshold characteristics in the same device permits one to combine transistor functions.

In FIG. 3a, an electrical schematic of a multiple emitter resonant tunneling hot electron transistor (MERHET) 20 according to the invention is shown and includes a base terminal 22, first and second emitter terminals 24 and 26 and a collector terminal 28. Referring to FIG. 3b, MERHET 20 includes a multi-layer emitter 30 with an undoped layer 34 initially grown on a substrate 38 using MBE. By selectively using FIB, first and second spaced strips 42 and 46 are created within the undoped layer 34. FIB methods inject dopants into the first and second strips 42 and 46 to alter doping characteristics $n^+_1$ of the first strip 42 and doping characteristics $n^+_2$ of the second strip 46.

MERHET 20 further includes a MBE regrowth boundary layer 50 grown on layer 34 using MBE after first and second strips 42 and 46 have been altered using FIB. A first barrier layer 54 is grown using MBE on regrowth boundary layer 50. A quantum well layer 58 is grown on first barrier layer 54 using MBE. A second barrier layer 62 is grown on quantum well layer 58. A base layer 64, a separating layer 66, and a collector layer 68 are consecutively grown using MBE on second boundary layer 62. Layers 50, 54, 58, and 62 form a double barrier resonant tunnel junction 70.

The unique doping characteristics of the strips 42 and 46 alter current-voltage characteristics of the transistor 10, as will be described further below. An inner section 70 and first and second outer sections 72 and 76 remain undoped. In FIG. 3c, a top view of MEHRET 20 shows first and second emitter terminals or contacts 80 and 82, base terminals or contacts 86 and 88, and a collector terminal or contact 90.

MEHRET 20 of FIG. 3 can be used as a digital half adder circuit. FIG. 4 illustrates current-voltage characteristics of MEHRET 20 implemented as a digital half adder. A half adder truth table is provided below:

| Half Adder Truth Table | | | | |
|---|---|---|---|---|
| $IN_1$ | $IN_2$ | TOTAL BASE-EMITTER VOLTAGE | SUM | CARRY |
| 0 | 0 | 0 | 0 | 0 |
| 0 | 1 | 1 | 1 | 0 |
| 1 | 0 | 1 | 1 | 0 |
| 1 | 1 | 2 | 0 | 1 |

An input signal to base 22 is a sum of first and second input bits, $IN_1$ and $IN_2$, respectively. A sum signal 100 output by the first emitter 24 represents a digital sum of the base input signals. A carry signal 104 output by the second emitter 26 represents digital carry. The collector terminal 28 is connected to a voltage source which has a potential greater than a greatest expected base input signal.

The sum signal 100 output by the first emitter 24 is generated using resonant tunneling phenomena while the carry signal uses conventional transistor techniques. In other words, electrons in the quantum well of the sum emitter 24 are resonating when the total base voltage is equal to 1 $V_{BE}$ units and therefore emitter current is high $I_H$. The electrons do not resonate when $V_{BE}$ is equal to 0 or 2 $V_{BE}$ units and therefore emitter current is low $I_L$. The carry output of emitter 26 follows conventional transistor current-voltage characteristics.

Emitter layer 34 can be initially made of Gallium Arsenide (GaAs) prior to FIB implantation. Quantum well barrier layers 54 and 62 can be made of Aluminum Arsenide (AlAs). Quantum well 58 and base 64 can be made of GaAs. Separating layer 66 can be $Al_{0.3}Ga_{0.7}As$. Collector 68 can be made of $n^+$ doped GaAs. Other materials will be readily apparent.

In FIG. 5a, an electrical schematic of a multiple base resonant hot electron tunneling transistor (MBRHET) 150 according to the invention is shown and includes first and second base terminals 154 and 156, an emitter terminal 160 and a collector terminal 166. Referring to FIG. 5b, a multi-layer base 170 includes an initially undoped layer 172 grown on a collector layer 174 using MBE. By selectively using FIB, first and second strips 178 and 180 are created within the layer 172. FIB methods inject dopants into the first and second strips 178 and 180 of the layer 172 to alter doping characteristics $n^+_1$ of the first strip 178 and doping characteristics $n^+_2$ of the second strip 180.

A resonant tunneling junction 184 including a plurality of layers (barrier layers, quantum well layer, etc. as with FIG. 3b) is grown using MBE on the layer 172 to complete the base layer 170. An emitter layer 188 is grown using MBE on base layer 170. FIG. 5c illustrates MBRHET 150 with a resonant tunneling junction 194 adjacent a collector layer 196.

In FIG. 6a, an electrical schematic of a multiple collector resonant hot electron tunneling transistor (MCRHET) 200 according to the invention is shown and includes a base terminal 216, an emitter terminal 218 and first and second collector terminals 224 and 226. Referring to FIG. 6b, a multi-layer collector 230 includes an initially undoped layer 234 grown on a substrate (not shown) using MBE. By selectively using FIB, first and second strips 236 and 238 are created within the layer 234. FIB methods inject dopants into the first and second strips 236 and 238 of the layer 234 to alter doping characteristics $n^+_1$ of the first strip 236 and doping characteristics $n^+_2$ of the second strip 238.

A resonant tunneling junction 242 including a plurality of layers (barrier layers, quantum well layer, etc. as with FIG. 3b) is grown using MBE on the layer 234. A base layer(s) 246 is/are grown using MBE on collector layer 230. An emitter layer(s) is/are grown using MBE on base layer 246.

While the resonant tunneling junctions 70, 184 and 242 have been described as including two barrier layers with a quantum well therebetween, additional barrier layers, quantum well layers, and regrowth layers can be used.

While the emitter, base and collector layers in the Figures have rectangular or square cross-sections, one skilled in the art can appreciate that other shapes and/or cross-sections can be used. Furthermore, the FIB methods can use n-type, p-type or other dopants. The emitter terminal(s), the base terminal(s) and the collector terminal(s) are connected to the respective layers in a conventional manner.

In FIG. 7, a fabrication system 400 for fabricating transistors according to the invention is illustrated. First and second MBE processing devices or chambers 408 and 416 and an etching device or chamber 420 are connected to each other using an ultra high vacuum (UHV) tunnel 424. UHV shuttle 430 maintains the required high vacuum during transportation to a FIB processing device or chamber 434. The fabrication system 400 is disclosed in "Nanostructures Processing By Focused Ion Beam Implantation", Journal of Vacuum Science & Technology B (Nov.-Dec. 1991), which is hereby incorporated by reference.

As can be appreciated, the combined FIB and MBE techniques can be implemented in circuits other than the half adder circuit disclosed above. The present invention can vastly reduce the number of required transistors for logic gates having different boolean operations which use the same input signals. As described above, two independent operations can be performed on the same inputs using a single transistor. Chip size and cost can be effectively reduced. Other objects, features and advantages will be readily apparent.

The various advantages of the present invention will become apparent to those skilled in the art after a study of the foregoing specification and following claims.

What is claimed is:

1. A method for simultaneously providing a plurality of functions from a single transistor having a base, a collector and an emitter, comprising the steps of:
   (a) growing a first layer using molecular beam epitaxy (MBE), wherein said first layer is initially undoped;
   (b) bombarding a first strip of said first layer with impurity ions using focused ion beam processing to create a first doping characteristic for said first strip;
   (c) bombarding a second strip of said first layer with impurity ions using focused ion beam processing to create a second doping characteristic for said second strip, wherein said second strip is spaced from said first strip; and
   (d) growing a resonant tunneling junction including a plurality of layers on said first layer.

2. The method of claim 1 wherein said plurality of layers of said resonant tunneling junction include at least one quantum well layer and at least two barrier layers.

3. The method of claim 2 wherein said plurality of layers of said resonant tunneling junction include a regrowth layer.

4. The method of claim 3 wherein said regrowth layer is grown using MBE on said resonant tunneling junction.

5. The method of claim 4 wherein a first barrier layer is grown using MBE on said regrowth layer.

6. The method of claim 5 wherein said quantum well layer is grown using MBE on said first barrier layer.

7. The method of claim 6 wherein a second barrier layer is grown using MBE on said quantum well layer.

8. The method of claim 7 wherein said first layer and said resonant tunneling junction form said emitter, and further comprising the steps of:
   (e) growing said base on said resonant tunneling junction of said emitter using MBE; and
   (f) growing said collector on said base using MBE.

9. The method of claim 7 wherein said first layer and said resonant tunneling junction form said collector, and further comprising the steps of:
   (e) growing said base on said resonant tunneling junction of said collector using MBE; and
   (f) growing said emitter on said base using MBE.

10. The method of claim 7 wherein said first layer and said resonant tunneling junction form said base, and further comprising the steps of:
    (e) growing said collector on said resonant tunneling junction of said base using MBE; and
    (f) growing said emitter on said first layer of said base using MBE.

11. The method of claim 7 wherein said first layer and said resonant tunneling junction form said base, and further comprising the steps of:
    (e) growing said emitter on said resonant tunneling junction of said base using MBE; and
    (f) growing said collector on said first layer of said base using MBE.

* * * * *